(12) United States Patent
Bakker et al.

(10) Patent No.: US 7,307,263 B2
(45) Date of Patent: Dec. 11, 2007

(54) LITHOGRAPHIC APPARATUS, RADIATION SYSTEM, CONTAMINANT TRAP, DEVICE MANUFACTURING METHOD, AND METHOD FOR TRAPPING CONTAMINANTS IN A CONTAMINANT TRAP

(75) Inventors: Levinus Pieter Bakker, Helmond (NL); Vadim Yevgenyevich Banine, Helmond (NL); Cornelis Petrus Andreas Maria Luijkx, Best (NL); Frank Jeroen Pieter Schuurmans, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 581 days.

(21) Appl. No.: 10/890,404

(22) Filed: Jul. 14, 2004

(65) Prior Publication Data

US 2006/0012761 A1 Jan. 19, 2006

(51) Int. Cl.
*G03F 7/20* (2006.01)
(52) U.S. Cl. ................. 250/492.2; 250/504 R
(58) Field of Classification Search .............. None
See application file for complete search history.

(56) References Cited

U.S. PATENT DOCUMENTS

| | | | |
|---|---|---|---|
| 6,359,969 B1 | 3/2002 | Shmaenok | 378/156 |
| 6,459,472 B1 | 10/2002 | De Jager et al. | 355/68 |
| 6,566,668 B2 * | 5/2003 | Rauch et al. | 250/504 R |
| 6,753,941 B2 * | 6/2004 | Visser | 355/30 |
| 6,838,684 B2 | 1/2005 | Bakker et al. | 250/492.2 |
| 7,057,190 B2 | 6/2006 | Bakker et al. | 250/492.2 |
| 2004/0184014 A1 | 9/2004 | Bakker et al. | 355/30 |
| 2006/0138348 A1 | 6/2006 | Bakker | 250/492.1 |
| 2006/0138362 A1 | 6/2006 | Bakker et al. | 250/504 |
| 2006/0151717 A1 | 7/2006 | Klunder et al. | 250/492.2 |

FOREIGN PATENT DOCUMENTS

| WO | WO99/42904 | 8/1999 |
|---|---|---|
| WO | WO02/054153 | 7/2002 |

* cited by examiner

*Primary Examiner*—Jack I. Berman
(74) *Attorney, Agent, or Firm*—Pillsbury Winthrop Shaw Pittman LLP

(57) ABSTRACT

A lithographic apparatus includes a radiation system that includes a source for producing a radiation beam, a contaminant trap arranged in a path of the radiation beam, and an illumination system configured to condition the radiation beam produced by the source, and a support for supporting a patterning device. The patterning device serves to impart the conditioned radiation beam with a pattern in its cross-section. The apparatus also includes a substrate table for holding a substrate, and a projection system for projecting the patterned radiation beam onto a target portion of the substrate. The contaminant trap includes a plurality of foils that define channels that are arranged substantially parallel to the direction of propagation of the radiation beam. The trap is provided with a gas supply system that is arranged to inject gas into at least one of the channels of the trap.

34 Claims, 12 Drawing Sheets

LITHOGRAPHIC APPARATUS, RADIATION SYSTEM, CONTAMINANT TRAP, DEVICE MANUFACTURING METHOD, AND METHOD FOR TRAPPING CONTAMINANTS IN A CONTAMINANT TRAP

FIELD

The present invention relates to a lithographic apparatus, a radiation system, a contaminant trap, a device manufacturing method, and a method for trapping contaminants in a contaminant trap.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one, or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through a radiation beam in a given direction (the "scanning"-direction) while synchronously scanning the substrate parallel or anti-parallel to this direction.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating, and a soft bake. After exposure, the substrate may be subjected to other procedures, such as a post-exposure bake (PEB), development, a hard bake, and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all of which are intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

In order to be able to image smaller features, it has been proposed to use extreme ultraviolet radiation (EUV) with a wavelength in the range of 5 to 20 nm, particularly 13 nm, or a charged particle beam, e.g. an ion beam or an electron beam, as the exposure radiation in a lithographic apparatus. These types of radiation require that the beam path in the apparatus be evacuated to avoid beam scatter and absorption. Because there is no known material suitable for making a refractive optical element for EUV radiation, EUV lithographic apparatus must use mirrors in the radiation (illumination) and projection system. Even multilayer mirrors for EUV radiation have relatively low reflectivities and are highly susceptible to contamination, further reducing their reflectivities and, hence, throughput of the apparatus. This imposes further requirements on the vacuum level that must be maintained and necessitates especially the hydrocarbon partial pressure to be kept very low.

At the same time, plasma radiation sources and the resist are substantial sources of contaminants that must be kept out of the illumination and projection systems. A discharge plasma source, for example, uses a discharge to create very hot partially ionized plasma, which emits EUV radiation. The plasma gas, which is often xenon (Xe), and debris from the source must be kept from entering the illumination system.

WO99/42904, incorporated herein by reference, discloses a contaminant trap, also called a filter, for trapping source debris. The known contaminant trap includes a plurality of foils or plates, which may be flat or conical and are arranged in a radial direction from the radiation source. The source, the filter, and the projection system may be arranged in a buffer gas, for example krypton, whose pressure is 0.5 torr. The contaminant particles then take on the temperature of the buffer gas, for example, room temperature, thereby sufficiently reducing the particles' velocities before they enter the filter. The pressure in the known contaminant trap is equal to that of its environment. This trap is arranged at 2 cm from the source, and its plates have a length, in the propagation direction of the radiation, of at least 1 cm and preferably 7 cm. This design requires relative large and thus costly collecting and guiding/shaping optics to bundle and shape the source radiation and guide it to the mask.

European Patent Application No. 01203899.8 describes a further improved device for trapping debris, such as may be emitted by a plasma source or from a resist exposed to EUV radiation. This document describes a contaminant trap including a first set of plate members arranged parallel to the direction of propagation of the radiation beam, and a second set of plate members that is arranged parallel to the direction of propagation. The first and second sets are spaced apart from one another along an optical axis of the radiation beam. There is a space between the first and second set of plate members. Flushing gas is supplied to that space to provide a high gas pressure to trap the contaminant particles. The two sets of plate members are designed such that leakage of the gas is minimized and that the gas pressure outside the trap is kept low. However, still, an amount of EUV is also absorbed by this gas with relatively high pressure.

SUMMARY

It is an aspect of the present invention to further improve trapping and/or mitigating debris, while having a relatively simple design for the contaminant trap.

According to an aspect of the invention, there is provided a lithographic apparatus that includes a radiation system that includes a source for the production of radiation and an illumination system that is configured to condition a radiation beam produced by the source. The apparatus also includes a support structure for supporting a patterning device. The patterning device serves to impart the conditioned radiation beam with a pattern in its cross-section. The apparatus further includes a substrate table for holding a substrate, and a projection system for projecting the patterned radiation beam onto a target portion of the substrate. The radiation system also includes a contaminant trap arranged in a path of the radiation beam. The contaminant trap includes a plurality of foils that define channels which are arranged substantially parallel to the direction of propagation of the radiation beam. The contaminant trap is provided with a gas supply system which is arranged to inject gas into at least one of the channels of the contaminant trap.

It has been found that in use, a lithographic apparatus according to the invention shows a significantly reduced amount of contaminating particles downstream of the contaminant trap. The "dirty gas", i.e. gas with clusters of electrode material or other debris, may be trapped by the contaminant trap, may have entered the contaminant trap and left the contaminant trap upstream of the contaminant trap or may not even have entered the contaminant trap. In all these events, much less contaminating particles are present downstream the contaminant trap, as compared to the number of contaminating particles downstream the contaminant trap in a lithographic apparatus known from the prior art.

In an embodiment of a lithographic apparatus according to the invention, in at least one of the foils, at least one opening is provided for injection of gas. This allows for an adoption of the contaminant traps known of the prior art for use in a lithographic apparatus according to the invention.

In an embodiment of the lithographic apparatus according to the invention, the gas supply system and the contaminant trap are arranged such that gas may be injected in an injection-direction, which is different from a direction which is substantially transverse with respect to the direction of propagation of the radiation beam. It has been found that such an embodiment, in use, shows even less contaminants downstream the contaminant trap. This embodiment may be further improved when the injection direction is substantially upstream from the direction of propagation of the radiation beam.

In an embodiment of a lithographic apparatus according to the invention, at least one of the at least one opening mentioned above is provided in an outer foil or plate of the contaminant trap. This allows for injecting gas into the contaminant trap. The contaminant traps known from the prior art may be adapted for use in a lithographic apparatus according to the invention.

In an embodiment of a lithographic apparatus according to the invention, the contaminant trap includes an inner substantially cylindrical or conical foil or plate in which at least one of the at least one opening mentioned above is provided. This also leads to a relatively simple design of a contaminant trap for use in a lithographic apparatus according to the invention.

In an embodiment according to the invention, a number of foils are provided with slots, which allow for spreading of the injected gas over the channels of the contaminant trap. By this measure, the uniformity of the gas pressure along the direction perpendicular to the radiation beam may be increased. This may improve the efficiency of the contaminant trap or the so-called stopping power.

In an embodiment of a lithographic apparatus according to the invention, the apparatus is provided with a drain system which is arranged to produce a transverse flow of gas in a radial and outwards direction with respect to the direction of propagation of the radiation beam and along an entrance of the contaminant trap, such that the transverse flow of gas includes at least part of the injected gas. This embodiment shows, in use, an even more improved trapping or mitigating of contaminants.

In an embodiment of lithographic apparatus according to the invention, the radiation system includes a collector for collecting the radiation produced by the source. The contaminant trap is placed between the source and the collector, and the apparatus is further arranged to provide between the source and the contaminant trap a crossing gas-flow across the radiation beam and in a direction substantially transverse the direction of propagation of the radiation beam. It turns out that with the aid of the crossing gas-flow across the radiation beam, the contaminants are extremely well mitigated, i.e. removed out of the radiation beam. This may occur either before the contaminants enter the contaminant trap or when contaminants are "rejected" into an upstream direction out of the contaminant trap.

According to an aspect of the invention, there is provided a contaminant trap suitable for use in a path of a radiation beam within a radiation system of a lithographic apparatus. The contaminant trap includes a plurality of foils dividing channels which are arranged substantially parallel to the direction of propagation of the radiation beam. The contaminant trap is provided with a gas supply system which is arranged to inject gas into at least one of the channels of the contaminant trap.

According to an aspect of the invention, there is provided a radiation system for providing a conditioned radiation beam for use in a lithographic apparatus. The radiation system includes a source for production of radiation and a collector for collecting the radiation. The radiation system further includes a contaminant trap which is situated between the source and the collector. The contaminant trap includes a plurality of foils defining channels which are arranged substantially parallel to the direction of propagation of the radiation beam. The contaminant trap is provided with a gas supply system which is arranged to inject gas into at least one of the channels of the contaminant trap.

According to an aspect of the invention, there is provided a device manufacturing method that includes providing a substrate, conditioning a radiation beam with a radiation system that includes a source for producing radiation and an illumination system for conditioning a radiation beam produced by the source, using a patterning device to impart the conditioned radiation beam with a pattern in its cross-section, projecting the patterned radiation beam onto a target portion of the substrate, and providing a contaminant trap in a path of the radiation beam produced by the source. The contaminant trap includes a plurality of foils that define channels that are arranged substantially parallel to the direction of propagation of the radiation beam. The method further includes injecting a gas into at least one of the channels of the contaminant trap.

According to an aspect of the invention, there is provided a method for improving trapping of contaminants in a contaminant trap which is arranged in a path of a radiation beam, the contaminant trap includes a plurality of foils that define channels which are arranged substantially parallel to the direction of propagation of the radiation beam. The method includes injecting a gas into at least one of the channels of the contaminant trap.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" as used herein should be broadly interpreted as referring to a device that can be used to impart a conditioned radiation beam with a pattern in its cross-section so as to create a pattern in a target portion of the substrate. It should be noted that the pattern imparted to the conditioned radiation beam may not exactly correspond to the desired pattern in the target portion of the substrate. Generally, the pattern imparted to the conditioned radiation beam will correspond to a particular functional layer in a device being created in the target portion, such as an integrated circuit.

The patterning device may be transmissive or reflective. Examples of the patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the radiation beam, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
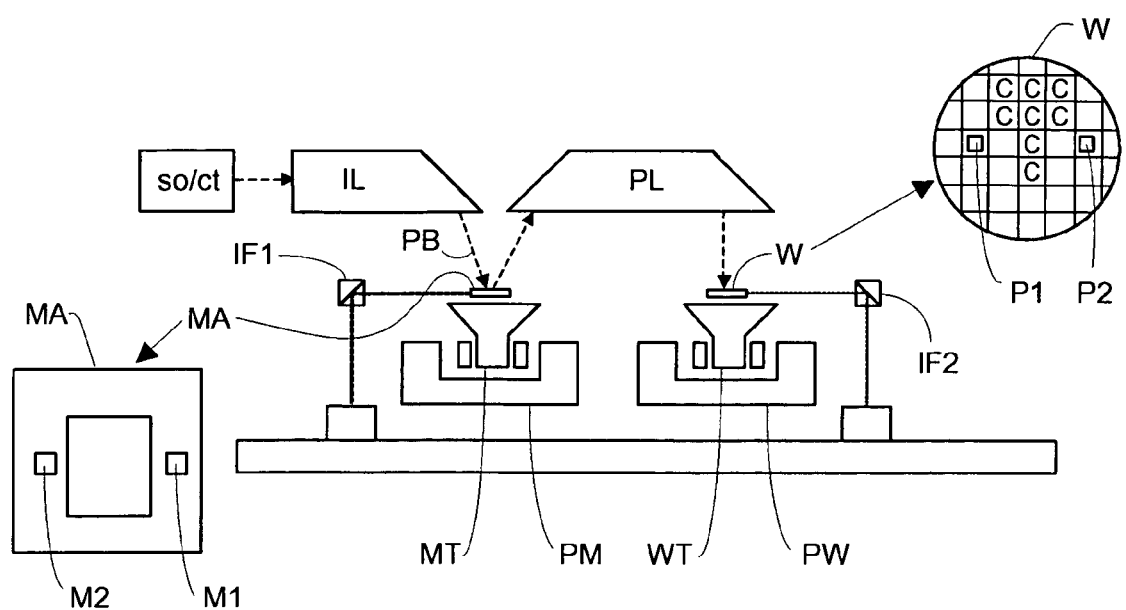
FIG. 1 depicts a lithographic apparatus according to an embodiment of the invention.

FIG. 1 schematically depicts a lithographic apparatus according to a particular embodiment of the invention. The apparatus includes an illumination system (illuminator) IL for providing a conditioned radiation beam PB of radiation (e.g. UV or EUV radiation), a first support structure (e.g. a mask table) MT for supporting a patterning device (e.g. a mask) MA and connected to a first positioner PM for accurately positioning the patterning device with respect to item PL, a substrate table (e.g. a wafer table) WT for holding a substrate (e.g. a resist-coated wafer) W and connected to a second positioner PW for accurately positioning the substrate with respect to item PL, and a projection system (e.g. a reflective projection lens) PL for imaging a pattern imparted to the conditioned radiation beam PB by the patterning device MA onto a target portion C (e.g. comprising one or more dies) of the substrate W.

As here depicted, the apparatus is of a reflective type (e.g. employing a reflective mask or a programmable mirror array of a type as referred to above).

The illuminator IL receives a beam of radiation from a radiation source SO/CT which includes a contaminant trap CT for filtering contaminating particles. Such a contaminant trap is described in WO 99/42904, which is incorporated herein by reference. The contaminant trap is situated in a path of the radiation beam having its origin at the source. The contaminant trap includes a plurality of foils defining channels which are arranged substantially parallel to the direction of propagation of the radiation beam. A radiation system including a contaminant trap is also disclosed in WO 02/054153, also incorporated herein by reference. The source and the lithographic apparatus may be separate entities, for example, when the source is a plasma discharge source. In such cases, the source is not considered to form part of the lithographic apparatus and the radiation beam is generally passed from the source SO/CT to the illuminator IL with the aid of a radiation collector that includes, for example, suitable collecting mirrors and/or a spectral purity filter. In other cases, the source may be integral part of the apparatus, for example, when the source is a mercury lamp. The source SO/CT and the illuminator IL may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioner PW and position sensor IF2 (e.g. an interferometric device), the substrate table WT can be moved accurately, so as to position different target portions C in the path of the beam PB. Similarly, the first positioner PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes the programmable patterning device, such as a programmable mirror array of a type as referred to above.

Combinations and/or variations on the above described modes of use or entirely different modes of use may also be employed.

Figure 2:
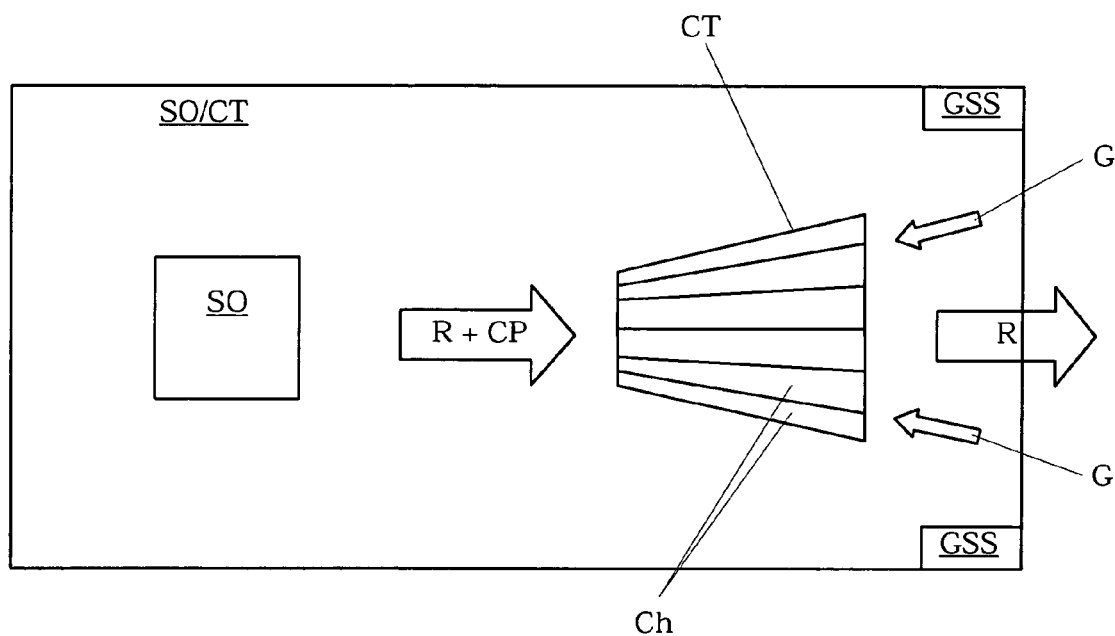
FIG. 2 schematically depicts a part of the lithographic projection apparatus of FIG. 1 in more detail.

FIG. 2 depicts a portion of a lithographic apparatus according to FIG. 1. FIG. 2 shows, in particular, the source and contaminant trap SO/CT. As shown schematically, radiation R is originating from source SO and propagates into the direction of the contaminant trap CT. It should be borne in mind that the radiation propagates from the source in all directions. For the sake of clarity, only the radiation which will propagate through the contaminant trap is depicted by means of open arrows. It should further be understood that the radiation propagates in a diverging fashion through the contaminant trap which is generally designed in correspondence with these directions of propagation. Also, contaminating particles CP move towards and into the contaminant trap CT. In a lithographic apparatus according to the invention, the contaminant trap CT is provided with a gas supply system GSS which is arranged to inject gas into at least one of the channels Ch of the contaminant trap CT. In FIG. 2, this is schematically depicted by the arrows G. It has been found that in operation, much less contaminating particles CP leave the contaminant trap CT in the direction of propagation of the radiation beam in comparison with the number of contaminating particles entering the contaminant trap in the direction of propagation of the radiation beam. It is possible to inject the gas into the contaminant trap, for example, by the use of mini nozzles (not shown). These may be directed such that the gas is injected into the contaminant trap CT at a side which forms an exit for the radiation leaving the contaminant trap. However it is also possible to inject gas into the contaminant trap in different ways, as further discussed below. In FIG. 2, the gas supply system GSS is schematically shown as a source from which the gas G may be injected into the contaminant trap.

Figure 3A:
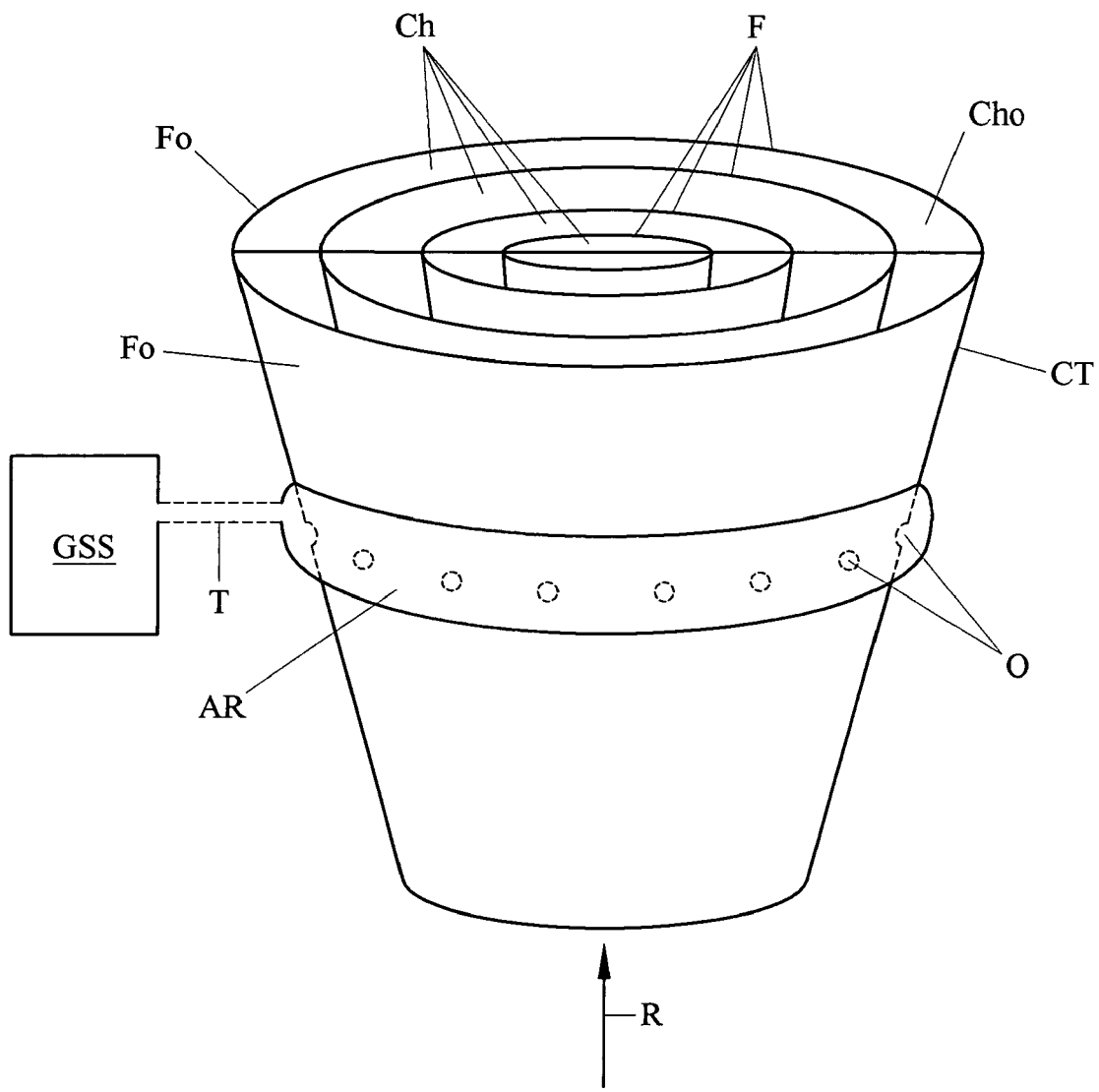
FIG. 3a schematically depicts an embodiment of a contaminant trap of the lithographic apparatus of FIG. 1.
Figure 3B:
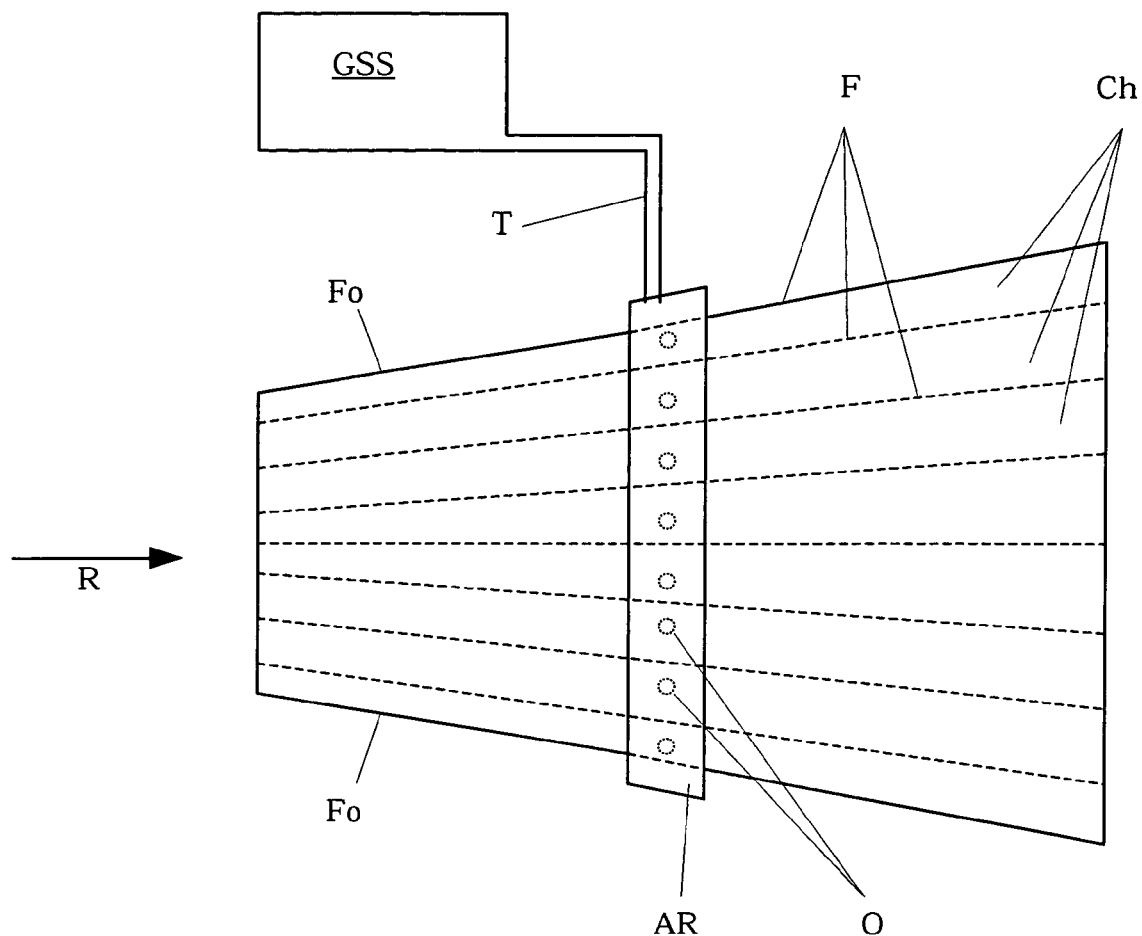
FIG. 3b schematically depicts another embodiment of the contaminant trap.

FIG. 3a schematically shows a first embodiment of a contaminant trap according to the invention and for use in an embodiment of lithographic apparatus according to the invention. The contaminant trap includes a plurality of foils F that define channels CH. The term "foils" as used herein is intended to be broadly construed and not limited to particular shapes. In addition, the term foils as used herein may also be referred to as "plates." The channels CH are arranged substantially parallel to the direction of propagation of the radiation beam. This direction is indicated by the arrow R. Strictly speaking, the direction of propagation of the radiation beam cannot be indicated by one arrow R, as the beam diverges. The radiation indicated by the arrow R should therefore not be interpreted in a narrow sense. This also applies to the other figures. So in this case, the contaminant trap CT is provided with a gas supply system GSS which is arranged to inject gas into the channel CH of the contaminant trap CT. At least one opening O is provided for injection of gas in an outer foil Fo. In the embodiment shown in FIG. 3a, each opening O shown is provided with gas from the gas supply system GSS via a tube T which is connected with an annular ring AR enclosing each opening O shown, thereby defining a path for a gas-flow from the gas supply system GSS to each opening O. The annular ring AR is clamped or sealingly fixed onto the outer foil Fo so that not much gas, if any, can leak from the path between the gas supply system GSS and each opening O. In this embodiment, the inner foils Fi are provided with slots (not shown) so that the gas can spread via the slot throughout all the channels of the contaminant trap. FIG. 3b shows an embodiment in which the foils are oriented such that gas may directly be injected into each channel. In this embodiment, the foils F are not concentrically oriented as in FIG. 3a but substantially flat in shape and situated next to each other. Each channel Ch has via an opening O in the outer foil Fo, and the annular ring AR and tube T a direct connection with the gas supply system GSS.

Figure 4A:
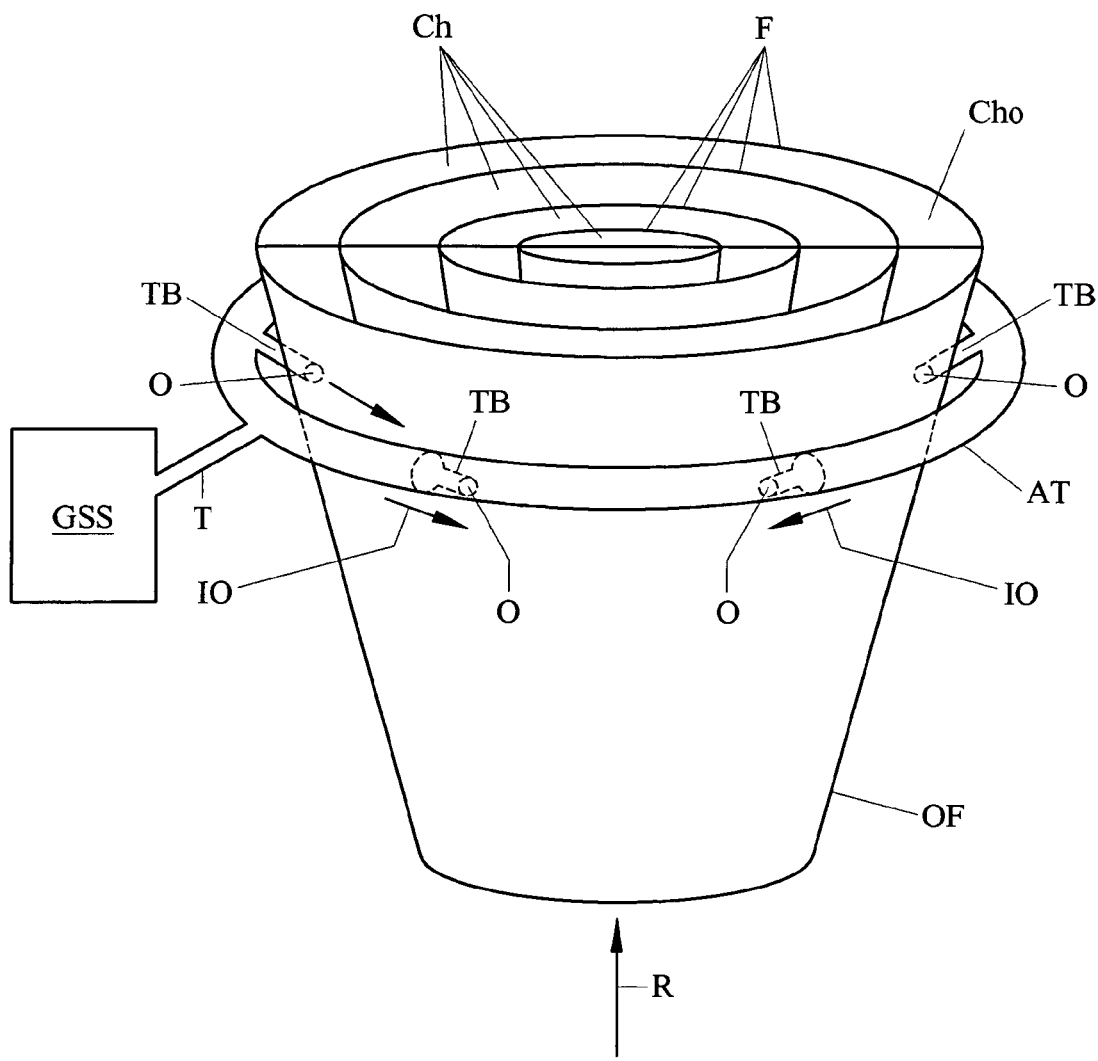
FIG. 4a schematically depicts another embodiment of the contaminant trap.
Figure 4B:
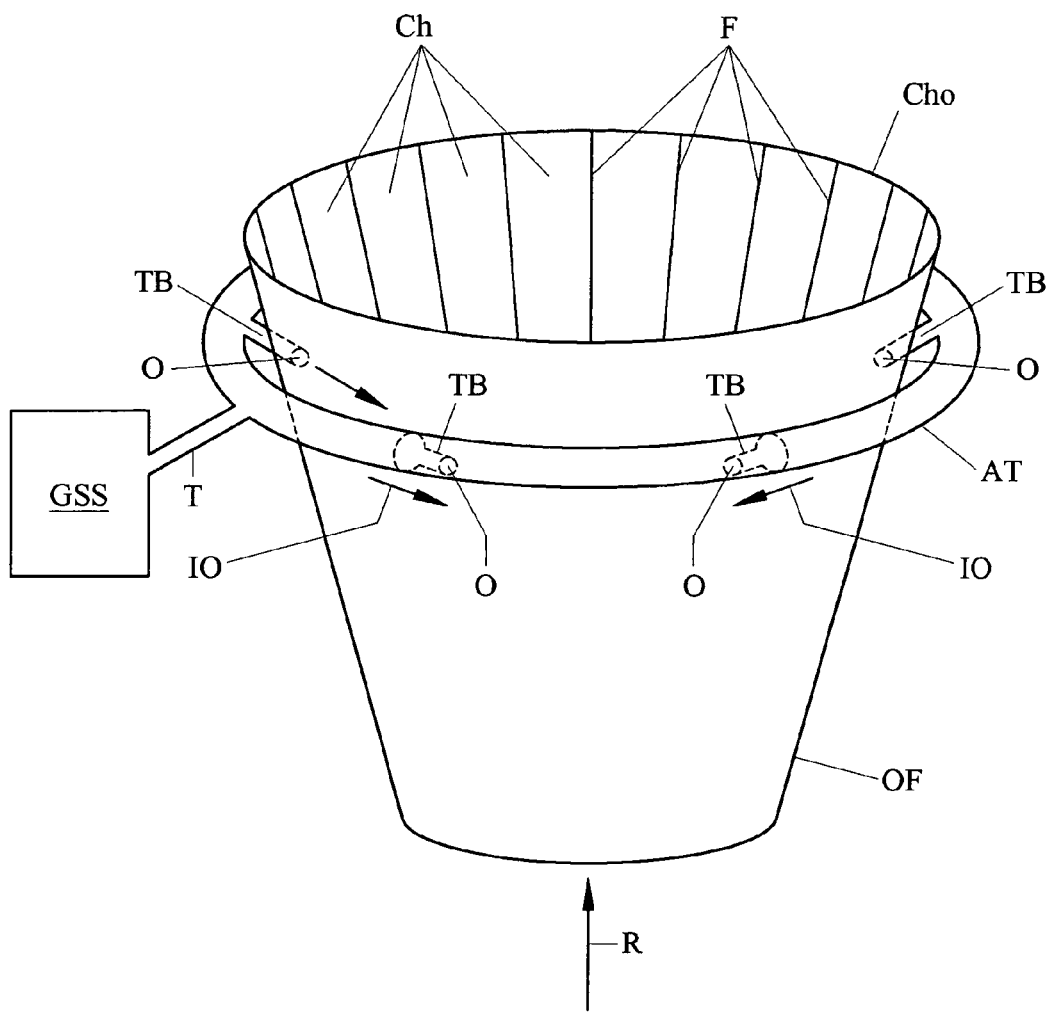
FIG. 4b schematically depicts another embodiment of the contaminant trap.

FIG. 4a schematically shows a third embodiment of a contaminant trap according to the invention and for use in an embodiment of a lithographic apparatus. In this embodiment, the connection to the gas supply system GSS and each opening O is formed by tube T which is connected with an annular tube AT having tubular branches TB. Each tubular branch connects with an opening O. The gas supply system GSS and the contaminant trap CT are arranged such that gas can be injected in an injection direction which is different from a direction substantially transverse with respect to the direction of propagation of the radiation beam. The latter direction is represented by arrow R, whereas the injection direction is represented by arrows ID. In this embodiment the injection direction ID is substantially upstream the direction of propagation of the radiation beam. Although not shown in detail in FIGS. 3a and 4a, the inner foils Fi of the contaminant trap CT may each be provided with at least one opening or a slot to increase the uniformity along the direction perpendicular to the direction of propagation of the radiation beam. FIG. 4b shows an embodiment in which the foils F are oriented such that gas may directly be injected into each channel CH of the trap CT. An advantage of the embodiments is that the radiation beam is not disturbed by connections between the gas supply system GSS and the contaminant trap CT.

Figure 5A:
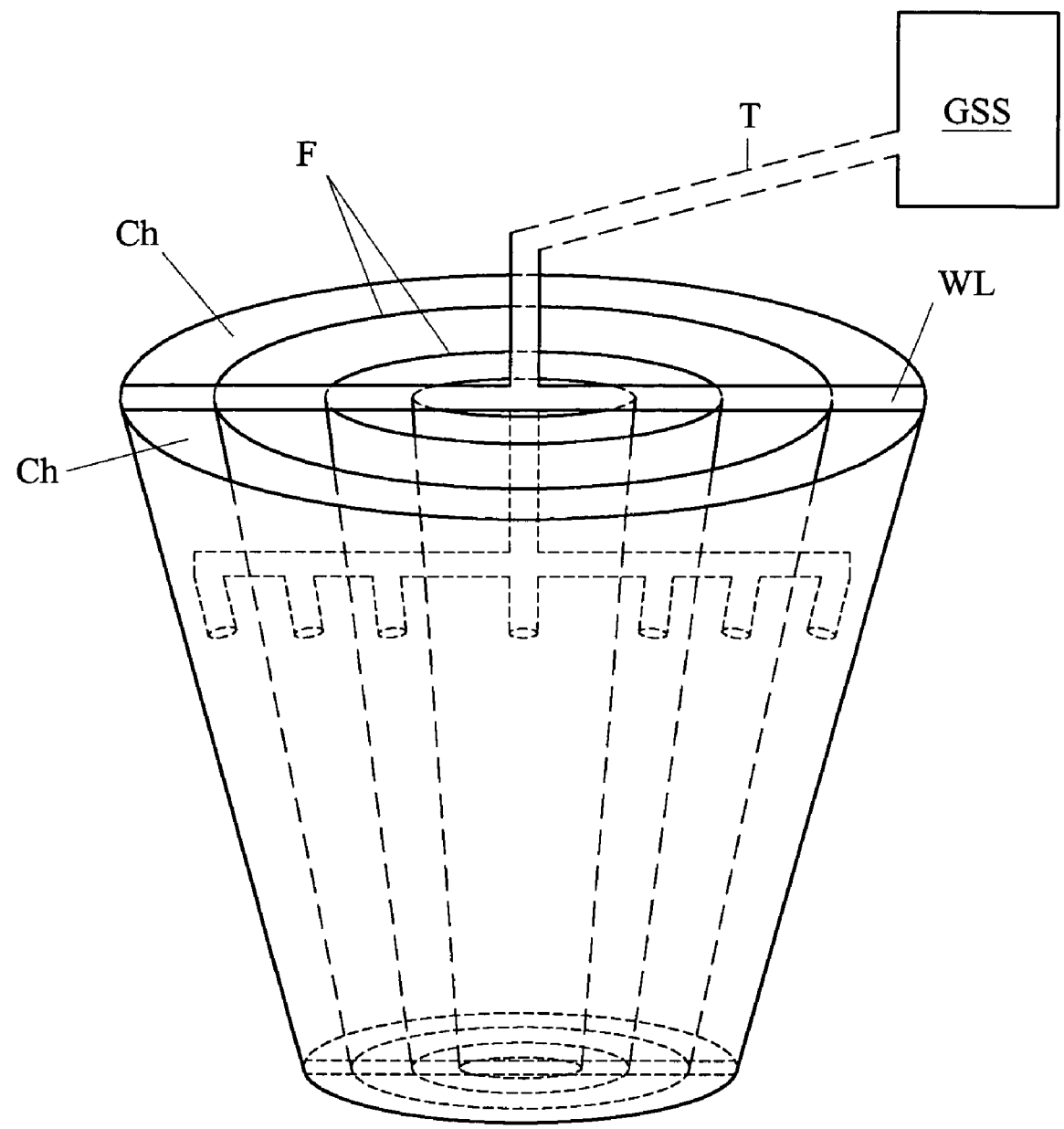
FIG. 5a schematically depicts another embodiment of the contaminant trap.
Figure 5B:
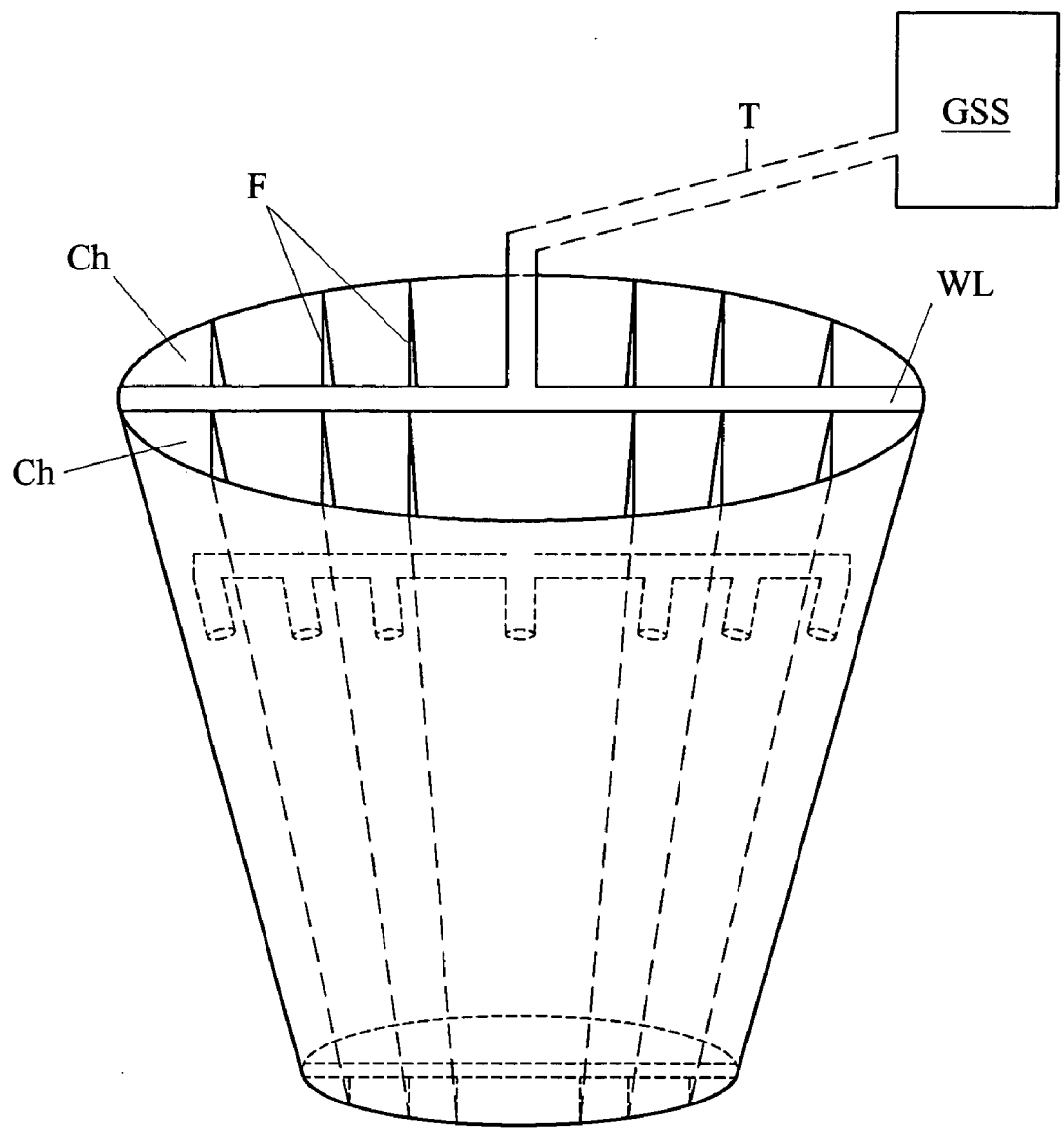
FIG. 5b schematically depicts another embodiment of the contaminant trap.

FIG. 5a shows a fifth embodiment of the contaminant trap according to the invention and for use in an embodiment of a lithographic apparatus. In this embodiment, there is a direct connection between the gas supply system GSS and each channel of the contaminant trap CT so as to achieve rapidly an uniform pressure across the contaminant trap. A wall WL connecting the foils F and dividing the channels CH in two parts is connected with the tube T which forms the path between the gas supply system GSS and the contaminant trap CT. The tube T extends in wall WL into many subtubes. Each subtube ends up in an opening in wall WL. FIG. 5b shows an alternative embodiment wherein the channels CH are not concentrically oriented with respect to each other but parallel and situated next to each other.

Figure 6:
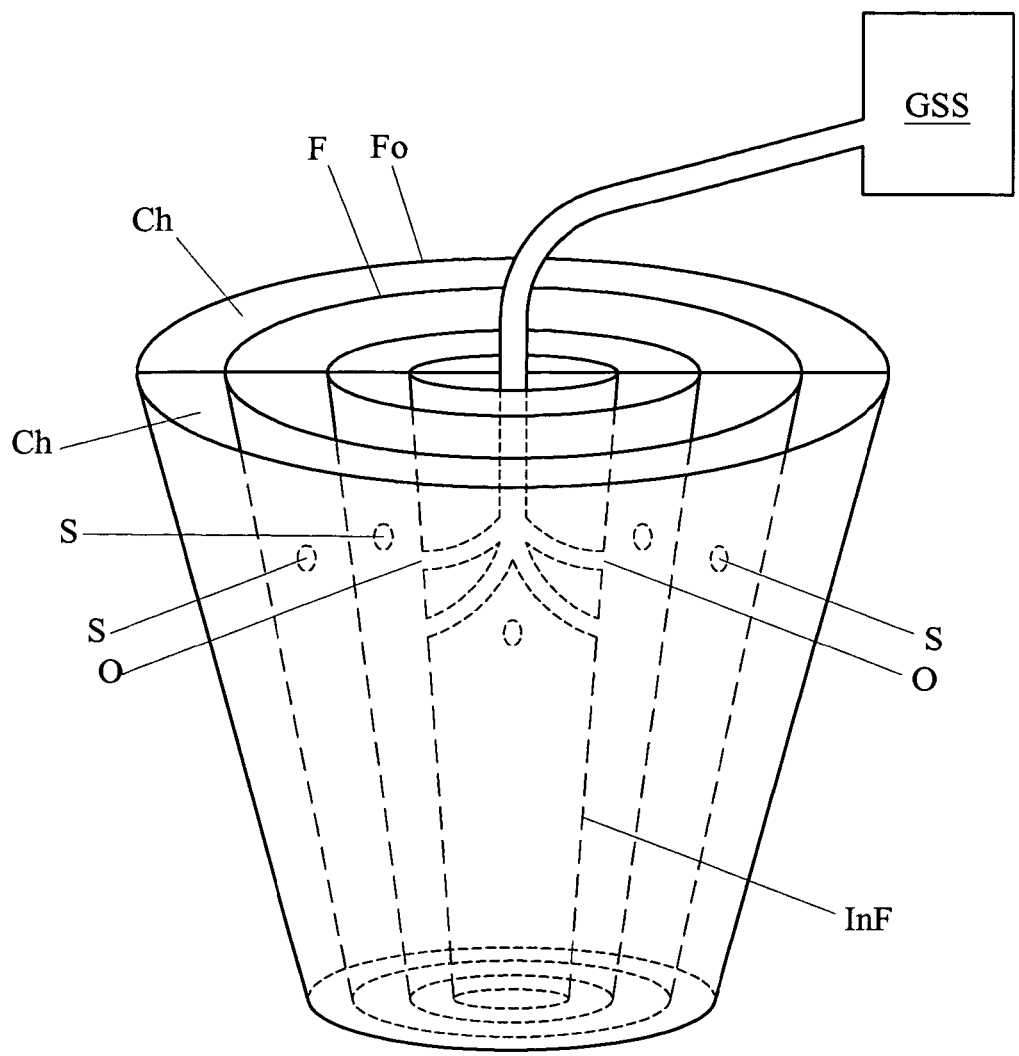
FIG. 6 schematically depicts another embodiment of the contaminant trap.

FIG. 6 shows schematically a seventh embodiment of a contaminant trap CT according to the invention and for use in an embodiment of a lithographic apparatus. The contaminant trap CT includes an inner substantially cylindrically shaped or conically shaped foil or plate F in which at least one of openings O is provided. Also, in this embodiment, a number of foils or plates may be provided with slots S which allow for spreading of the injected gas over the channels Ch of the contaminant trap CT. As shown in the figures, it is possible to have foils F concentrically oriented with respect to each other, or next to each other and substantially parallel to the direction of propagation of the beam. In the latter embodiment, it is possible to have the foils F extending in a radial direction with respect to an axis of the contaminant trap, as shown in FIGS. 3b, 4b and 5b of this specification. In embodiments in which the foils F are not concentrically oriented with respect to each other, it is possible to inject gas directly into each channel CH of the contaminant trap CT. This may then be done through an opening in an outer foil Fo which is part of a support structure of the contaminant trap CT, i.e. a structure which support the foils which in use will "capture" contaminant particles. Slots may be provided in inner foils which form parts of the support structure.

All these embodiments are understood to fall within the scope of the invention.

Figure 7:
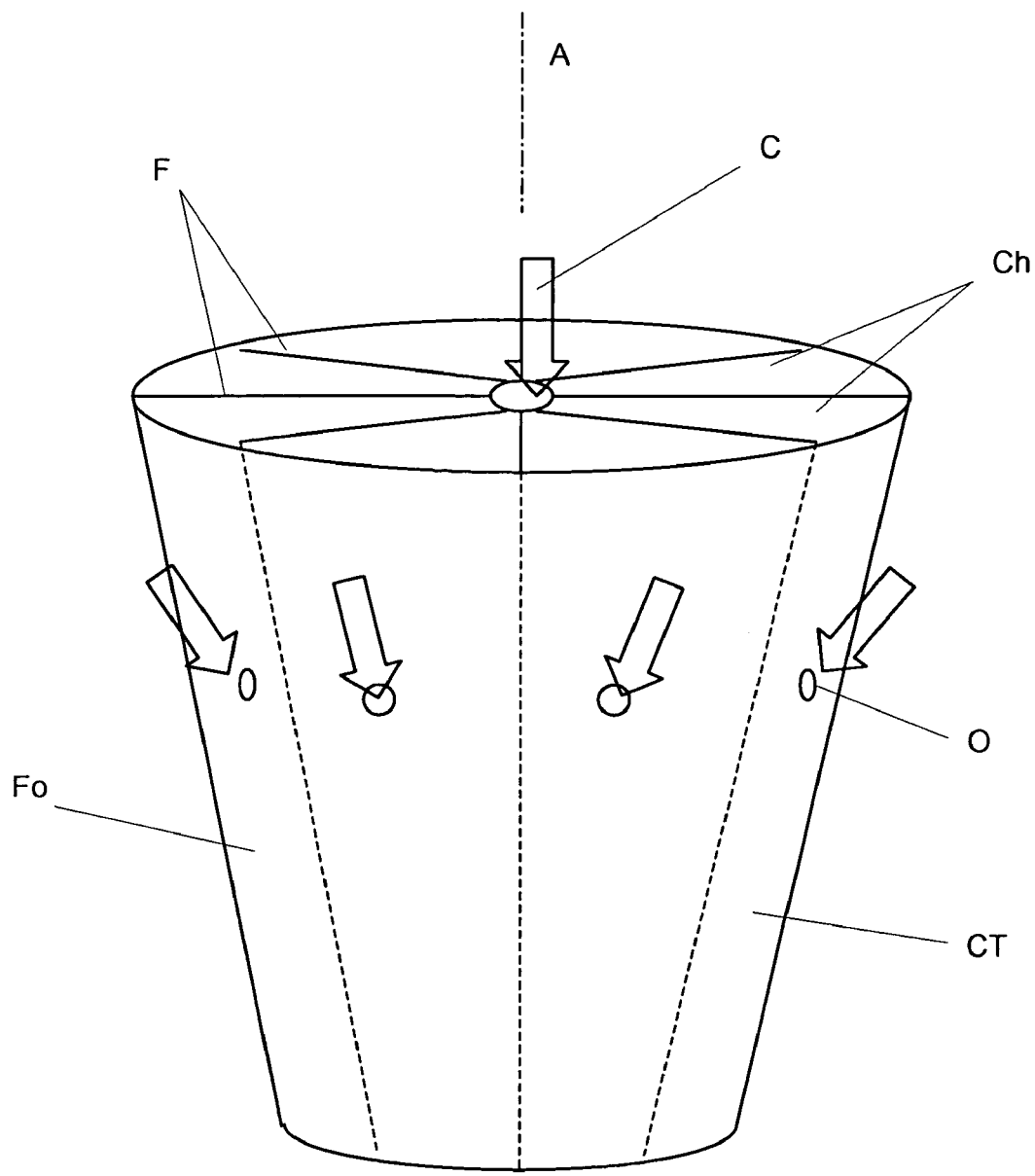
FIG. 7 schematically depicts another embodiment of the contaminant trap.

FIG. 7 schematically shows a part of the lithographic apparatus, namely the contaminant trap CT, in which the foils F are radially oriented with respect to the axis A of the trap. Only a few foils are shown for sake of clarity. This contaminant trap CT may be provided with openings O in the outer foil Fo so that gas may be injected into at least a number of the channels Ch. This is schematically indicated by the black arrows. The black arrow with reference C indicates another alternative with which gas is injected via a central distribution system in analogy with FIG. 6.

Figure 8:
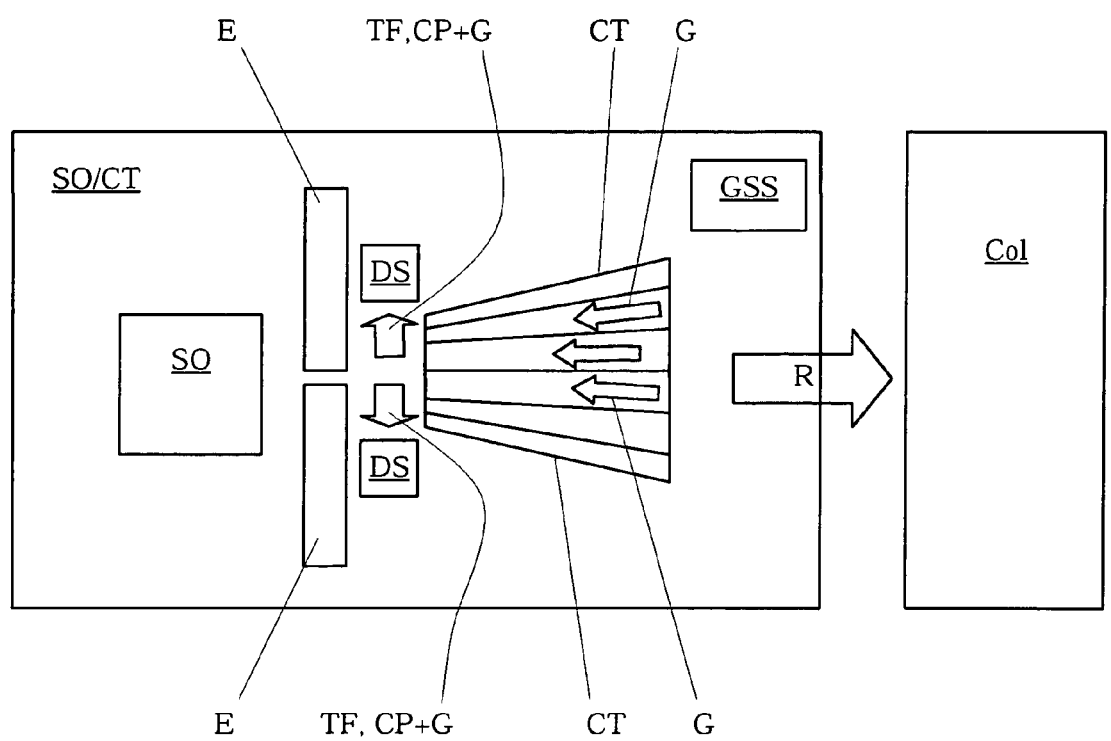
FIG. 8 schematically depicts a portion of the lithographic apparatus of FIG. 1.

FIG. 8 shows an embodiment of a lithographic apparatus according to the invention. The apparatus is provided with a drain system DS which is arranged to produce a transverse flow of gas in a radial and outwards direction with respect to the direction of propagation of the radiation beam and along an entrance of a contaminant trap CT, such that the transverse flow of gas includes at least part of the injected gas. The transverse flow is indicated by arrows indicated TF. The drain system DS may, for example, include a vacuum pump (not shown) which is arranged to suck gas away.

Figure 9:
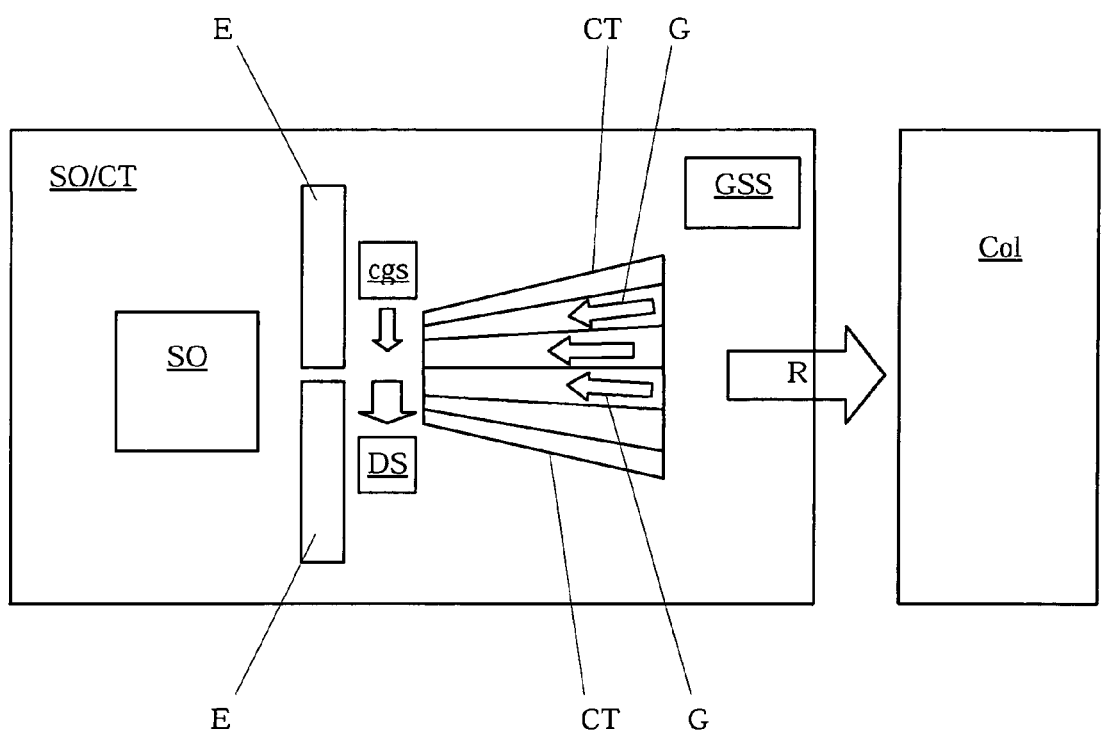
FIG. 9 schematically depicts another embodiment of a portion the lithographic apparatus.

FIG. 9 schematically shows another embodiment of a lithographic apparatus according to the invention. In this embodiment, the illumination system includes a source SO for production of radiation and a collector Col for collecting the radiation. The contaminant trap CT is placed between the source SO and the collector Col. The apparatus is further arranged to provide, between the source SO and the contaminant trap CT, a crossing gas-flow CG across a radiation beam (not shown) and in a direction substantially transverse with respect to the direction of propagation of the radiation beam. The latter direction is indicated by arrow R. The contaminant trap CT may be according to any of the embodiments discussed or any other embodiment of a contaminant trap CT according to the invention. For the sake of clarity, a connection between the gas supply system GSS and the contaminant trap CT is not shown. However, arrows G show a direction of gas injected into the contaminant trap CT. The crossing gas-flow CG is provided by a crossing gas supply system CGS which may or may not be part of the gas supply system GSS. The crossing gas supply system CGS includes an outlet (not shown) that ensures that the gas leaving the crossing gas supply system actually crosses the radiation beam in a direction substantially transverse with respect to the direction of propagation of the radiation beam. Preferably, this embodiment also includes a drain system DS. The drain system shown in FIG. 9 is arranged to suck both the crossing gas as well as the injected gas G towards it. A transverse flow of gas flows in a radial and outwards direction with respect to the direction of propagation of the radiation beam and along an entrance of the contaminant trap CT, such that the transverse flow of gas includes at least part of the injected gas as well as a number of contaminant particles. The embodiment shown in FIG. 9 has in operation been shown to dramatically reduce the number of contaminant particles CP leaving the contaminant trap CT at a position where the radiation leaves the contaminant trap. In other words, the embodiment shown in FIG. 9 has been shown to be very effective.

It should be borne in mind that the direction of the foils shown in the Figures may in another embodiment of a contaminant trap according to the invention be different from the direction shown. Also, other configurations of the foils, for example, as shown in European patent application 01203899.8 and international applications WO 99/42904, WO 02/054153, all of which are incorporated herein by reference, may be employed.

The type of gas used is preferably an inert gas that does not absorb much EUV and with an atomic weight that is large enough to give a sufficient momentum to contaminating particles when colliding with these contaminant particles, thereby changing the direction of movement of the contaminating particles so that these particles are more likely to be trapped when hitting the foil of the contaminant trap. Argon is, for example, a gas that meets these requirements.

While specific embodiments of the invention have been described above, it will be appreciated that the invention may be practiced otherwise than as described. The description is not intended to limit the invention.

What is claimed is:

1. A lithographic apparatus comprising:
   a radiation system comprising a source for producing a radiation beam, a contaminant trap arranged in a path of the radiation beam, and an illumination system configured to condition the radiation beam produced by said source;
   a support for supporting a patterning device, the patterning device serving to impart the conditioned radiation beam with a pattern in its cross-section;
   a substrate table for holding a substrate; and
   a projection system for projecting the patterned radiation beam onto a target portion of the substrate,
   said contaminant trap comprising a plurality of foils that define channels that are arranged substantially parallel to the direction of propagation of said radiation beam, wherein the contaminant trap is provided with a gas supply system that is arranged to inject gas into at least one of the channels of the contaminant trap, and wherein at least one of the foils comprises at least one opening for the gas injection.

2. A lithographic apparatus according to claim 1, wherein the gas supply system and the contaminant trap are arranged such that the gas is injected in an injection-direction that is different from a direction that is substantially transverse with respect to the direction of propagation of said radiation beam.

3. A lithographic apparatus according to claim 2, wherein the injection-direction is substantially upstream of the direction of propagation of said radiation beam.

4. A lithographic apparatus according to claim 1, wherein at least one of the openings is provided in an outer foil or plate of the contaminant trap.

5. A lithographic apparatus according to claim 1, wherein the contaminant trap comprises an inner substantially cylindrical or conical foil or plate in which the opening is provided.

6. A lithographic apparatus according to claim 1, wherein at least some of the plurality of foils are provided with slots that allow for spreading of the injected gas over the channels of the contaminant trap.

7. A lithographic apparatus according to claim 1, wherein the apparatus is provided with a drain system that is arranged to produce a transverse flow of gas in a radial and outwards direction with respect to the direction of propagation of the radiation beam and along an entrance of the contaminant trap such that the transverse flow of gas comprises at least part of the injected gas.

8. A lithographic apparatus according to claim 7, wherein the radiation system further comprises a collector for collecting the radiation produced by the source, wherein the contaminant trap is placed between the source and the collector, and wherein the apparatus is further arranged to provide between the source and the contaminant trap a crossing gas flow across the radiation beam and in a direction substantially transverse to the direction of propagation of the radiation beam.

9. A device manufactured by a lithographic apparatus according to claim 1.

10. A contaminant trap suitable for use in a path of a radiation beam within a radiation system of a lithographic apparatus, the contaminant trap comprising a plurality of foils that define channels that are arranged substantially parallel to the direction of propagation of said radiation beam, wherein the contaminant trap is provided with a gas supply system that is arranged to inject gas into at least one of the channels of the contaminant trap, and wherein at least one of the foils comprises at least one opening for the gas injection.

11. A contaminant trap according to claim 10, wherein the gas supply system and the contaminant trap are arranged such that gas is injected in an injection-direction that is different from a direction that is substantially transverse with respect to the direction of propagation of said radiation beam.

12. A contaminant trap according to claim 11, wherein the injection-direction is substantially upstream of the direction of propagation of said radiation beam.

13. A contaminant trap according to claim 10, wherein at least one of the openings is provided in an outer foil or plate of the contaminant trap.

14. A contaminant trap according to claim 10, wherein the contaminant trap comprises an inner substantially cylindrical or conical foil or plate in which the opening is provided.

15. A contaminant trap according to claim 10, wherein a plurality of foils are provided with slots that allow for spreading of the injected gas over the channels of the contaminant trap.

16. A radiation system for providing a conditioned radiation beam for use in a lithographic apparatus, the radiation system comprising:
   a source for producing a radiation beam;
   a collector for collecting the radiation beam,
   a contaminant trap that is situated between the source and the collector, the contaminant trap comprising a plurality of foils that define channels that are arranged substantially parallel to the direction of propagation of said radiation beam,
   wherein the contaminant trap is provided with a gas supply system that is arranged to inject gas into at least one of the channels of the contaminant trap, and wherein at least one of the foils comprises at least one opening for the gas injection.

17. A radiation system according to claim 16, wherein the gas supply system and the contaminant trap are arranged such that gas is injected into the contaminant trap in an injection-direction that is different from a direction that is substantially transverse with respect to the direction of propagation of said radiation beam.

18. A radiation system according to claim 17, wherein the injection-direction is substantially upstream of the direction of propagation of said radiation beam.

19. A radiation system according to claim 16, wherein at least one of the openings is provided in an outer foil or plate of the contaminant trap.

20. A radiation system according to claim 16, wherein the contaminant trap comprises an inner substantially cylindrical or conical foil or plate in which at least one of the openings is provided.

21. A radiation system according to claim 16, wherein a plurality of foils are provided with slots that allow for spreading of the injected gas over the channels of the contaminant trap.

22. A radiation system according to claim 16, wherein the radiation system is provided with a drain system that is arranged to produce a transverse flow of gas in a radial and outwards direction with respect to the direction of propagation of the radiation beam, and along an entrance of the contaminant trap such that the transverse flow of gas comprises at least part of the injected gas.

23. A radiation system according to claim 22, wherein the radiation system is further arranged to provide between the source and the contaminant trap a crossing gas flow across the radiation beam and in a direction transverse to the direction of propagation of the radiation beam.

24. A device manufacturing method comprising:
generating a radiation beam with a radiation source;
conditioning the radiation beam with an illumination system;
injecting gas into at least one channel of a contamination trap comprising a plurality of foils that define the channels disposed in a path of the radiation beam between the radiation source and the illumination system, the channels being arranged substantially parallel to the direction of propagation of the radiation beam, at least one of the foils comprising an opening through which the gas flows;
patterning the conditioned radiation beam with a patterning device; and
projecting the patterned radiation beam onto a target portion of a substrate.

25. A device manufacturing method according to claim 24, further comprising injecting the gas in an injection-direction which is different from a direction which is substantially transverse with respect to the direction of propagation of said radiation beam.

26. A device manufacturing method according to claim 24, wherein the injection-direction is substantially upstream the direction of propagation of said radiation beam.

27. A device manufacturing method according to claim 24, further comprising producing a transverse flow of gas in a radial and outwards direction with respect to the direction of propagation of the radiation beam and along an entrance of the contaminant trap, such that the transverse flow of gas comprises at least part of the injected gas.

28. A device manufacturing method according to claim 27, wherein the contaminant trap is provided between the radiation source and a collector for collecting the radiation, and wherein the method further comprises providing a crossing gas flow across the radiation beam and in a direction substantially transverse the direction of propagation of the radiation beam.

29. A device manufactured according to the method of claim 24.

30. A method for trapping contaminants in a contaminant trap that is arranged in a path of a radiation beam, the contaminant trap comprising a plurality of foils that define channels that are arranged substantially parallel to the direction of propagation of said radiation beam, at least one of the foils comprising at least one opening, the method comprising injecting a gas into at least one of the channels of the contaminant trap such that the gas flows through the at least one opening.

31. A method according to claim 30, further comprising injecting the gas in an injection-direction which is different from a direction which is substantially transverse with respect to the direction of propagation of said radiation beam.

32. A method according to claim 30, wherein the injection-direction is substantially upstream of the direction of propagation of said radiation beam.

33. A method according to claim 30, further comprising producing a transverse flow of gas in a radial and outwards direction with respect to the direction of propagation of the radiation beam and along an entrance of the contaminant trap, such that the transverse flow of gas comprises at least part of the injected gas.

34. A method according to claim 33, wherein the contaminant trap is provided between a source for production of the radiation and a collector for collecting the radiation, and wherein the method further comprises providing a crossing gas flow across the radiation beam and in a direction transverse to the direction of propagation of the radiation beam.

* * * * *